(12) United States Patent
Sasaki

(10) Patent No.: US 7,323,786 B2
(45) Date of Patent: Jan. 29, 2008

(54) SEMICONDUCTOR DEVICE PACKAGE OF STACKED SEMICONDUCTOR CHIPS WITH SPACERS PROVIDED THEREIN

(75) Inventor: Kou Sasaki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 178 days.

(21) Appl. No.: 11/063,852

(22) Filed: Feb. 24, 2005

(65) Prior Publication Data

US 2005/0184378 A1    Aug. 25, 2005

(30) Foreign Application Priority Data

Feb. 25, 2004    (JP) .............................. 2004-048992

(51) Int. Cl.
*H01L 23/48*    (2006.01)
*H01L 23/52*    (2006.01)
*H01L 29/40*    (2006.01)

(52) U.S. Cl. ...................................... 257/777; 257/778

(58) Field of Classification Search ................ 257/678, 257/684–686, 777–786
See application file for complete search history.

(56) References Cited

U.S. PATENT DOCUMENTS

| 6,545,365 B2* | 4/2003 | Kondo et al. ................ 257/777 |
| 2003/0047813 A1* | 3/2003 | Goller et al. ................ 257/777 |
| 2004/0012079 A1* | 1/2004 | Khiang ........................ 257/678 |

FOREIGN PATENT DOCUMENTS

| JP | 2002-057272 A | 2/2002 |
| JP | 2002-261233 A | 9/2002 |

* cited by examiner

*Primary Examiner*—Cuong Nguyen
(74) *Attorney, Agent, or Firm*—Sughrue Mion, Pllc.

(57) ABSTRACT

A semiconductor device package includes a plurality of stacked semiconductor chips and a spacer interposed therebetween. The spacer includes a first spacer and a second spacer stacked on one another. The first and the second spacers have different principal surfaces. If the second spacer has a larger principal surface than the first spacer, flexure of the upper semiconductor chip can be avoided.

14 Claims, 3 Drawing Sheets

RELATED ART

SEMICONDUCTOR DEVICE PACKAGE OF STACKED SEMICONDUCTOR CHIPS WITH SPACERS PROVIDED THEREIN

BACKGROUND OF THE INVENTION

1. Field of the Invention

The present invention relates to a semiconductor device package of a plurality of stacked semiconductor chips.

2. Description of Related Art

With a decrease in the size of mobile phones and portable equipment, demand for reducing the size of semiconductor devices used therefor is increasing. As an approach to meeting this demand, a technique to stack a plurality of semiconductor chips in one package is proposed. This technique is described in Japanese Unexamined Patent Application Publications No. 2002-261233 and 2002-57272, for example. FIG. 5 shows a configuration example of a semiconductor device using this technique.

As shown in FIG. 5, a semiconductor chip 3a is bonded to a substrate (interposer) 2 with adhesive, and a semiconductor chip 3b is placed thereabove with a spacer 4 interposed therebetween. The spacer 4 is placed in order to create a space for connecting a wire to an electrode of the lower semiconductor chip 3a. The spacer 4 and the semiconductor chips 3a and 3b are bonded with adhesive, for example. The electrode of the semiconductor chip 3a is connected to an electrode of the substrate 2 by a wire 5a. An electrode of the semiconductor chip 3b is connected to an electrode of the substrate 2 by a wire 5b. The semiconductor chips 3a and 3b, the spacer 4, and so on are packaged by a sealing resin 6.

In a conventional semiconductor device shown in FIG. 5, the spacer 4 needs to be located inward at a certain distance from a peripheral area of the lower semiconductor chip 3a where electrodes are placed since it is necessary to create a space for connecting a wire to those electrodes. Thus, if the upper semiconductor chip 3b placed on the spacer 4 is significantly larger than the spacer 4, flexure of the semiconductor chip 3b can occur since the spacer 4 supports the semiconductor chip 3b only at a small portion at the center of the chip. This can lead to bad bonding or deterioration in the quality of the semiconductor chip 3b.

Further, the sealing resin 6 is normally injected in one direction as shown in FIG. 6, which is in the direction of an arrow, for example. Thus, the density of the sealing resin 6 is low in an area 7 located in the vicinity of the spacer 4 and in the opposite side of the injection side, which causes a void to occur in this area. The spacer 4 is relatively thick due to its purpose of creating a certain space for connecting a wire to the electrode of the lower semiconductor chip 3a. Accordingly, the void occurring in the area 7 is large. The large void causes the package of the semiconductor device to be fragile and breakable.

SUMMARY OF THE INVENTION

According to one aspect of the present invention, there is provided a semiconductor device package which includes a plurality of semiconductor chips stacked on one another and a spacer interposed between the plurality of semiconductor chips. The spacer at least includes a first spacer and a second spacer placed above the first spacer. The first spacer and the second spacer have different principal surface areas.

The present invention allows preventing flexure of an upper semiconductor chip and occurrence of a void.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
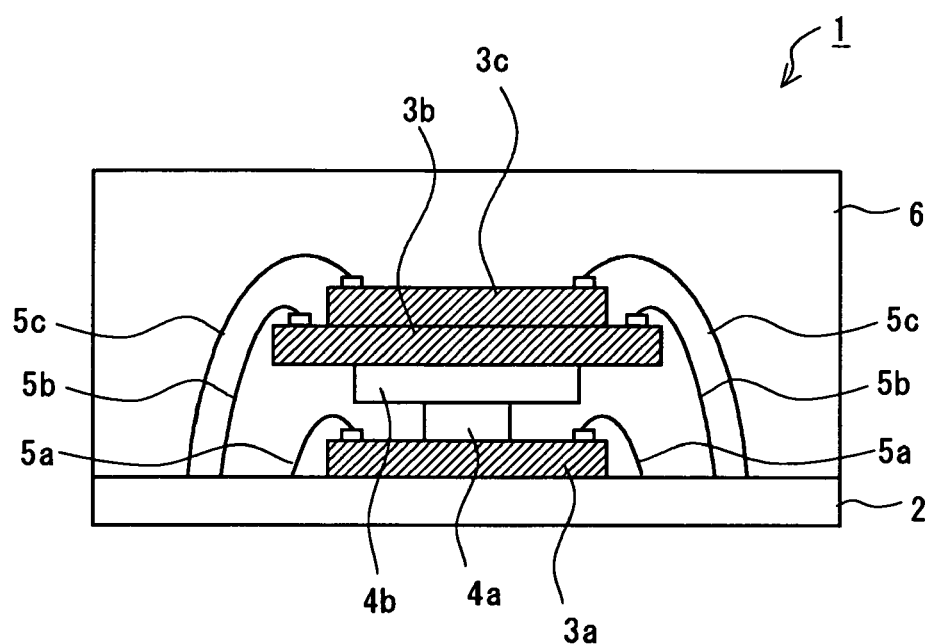
FIG. 1 is a fragmentary sectional view showing the structure of a semiconductor device according to a first embodiment of the invention.

FIG. 1 is a fragmentary sectional view showing the structure of a semiconductor device according to a first embodiment of the invention. A semiconductor chip 3a is bonded to a substrate (interposer) 2 with adhesive, silver paste, or the like. The adhesive may be sealing adhesive, for example. The semiconductor chip 3a includes various ICs such as a memory IC and a logic IC, and is made mainly of silicon or GaAs. This is the same for the semiconductor chips 3b and 3c described below.

A spacer 4a is bonded to the top surface of the semiconductor chip 3a with adhesive or the like. Further, in this embodiment, a spacer 4b is bonded to the top surface of the spacer 4a with adhesive or the like. The principal surface area of the spacer 4b is larger than that of the spacer 4a. The spacers 4a and 4b are made of a silicon chip, which is formed by dicing a part of a silicon wafer, for example. The spacers 4a and 4b are stacked on one another.

The spacer 4a is placed in order to create a space for connecting a wire 5a to an electrode of the semiconductor chip 3a. For this reason, the principal surface area of the spacer 4a is smaller than that of the semiconductor chip 3a. Thus, an electrode placed in the peripheral area of the semiconductor chip 3a is exposed when the spacer 4a is bonded to the chip. The spacer 4b, on the other hand, is placed to prevent flexure of the semiconductor chip 3b. In order to enhance the effect of preventing the flexure of the semiconductor chip 3b, the spacer 4b may be made of hard material, or a metal film such as tungsten may be formed on the principal surface of the spacer 4b.

The semiconductor chip 3b is bonded to the top surface of the spacer 4b with adhesive or the like. Further, in this example, a semiconductor chip 3c is bonded to the top surface of the semiconductor chip 3b with adhesive or the like. The principal surface area of the semiconductor chip 3c is smaller than that of the semiconductor chip 3b so that an electrode of the semiconductor chip 3b is exposed. Thus, no spacer is placed between the semiconductor chips 3b and 3c.

The electrode of the semiconductor chip 3a is connected to the electrode of the substrate 2 by the wire 5a. The electrode of the semiconductor chip 3b is connected to the electrode of the substrate 2 by a wire 5b. The electrode of the semiconductor chip 3c is connected to the electrode of the substrate 2 by a wire 5c. The semiconductor chips 3a, 3b, 3c, the spacer 4, and so on are packaged by a sealing resin 6. The sealing resin 6 is formed of a thermosetting resin, for example.

A method of manufacturing the semiconductor device of the first embodiment is briefly described below. First, adhesive is applied to the surface of the substrate 2, and the semiconductor chip 3a is placed thereon. The semiconductor chip 3a is fixed onto the substrate 2 when the adhesive is cured. Then, an electrode formed on the peripheral surface area of the semiconductor chip 3a and an electrode formed on the substrate 2 are connected by the wire 5a such as a gold wire.

Next, adhesive is applied to the top surface of the semiconductor chip 3a. The adhesive is applied to the surface area inward of the peripheral surface area where the electrode is formed, and the spacer 4a is placed thereon. The spacer 4a is fixed onto the semiconductor chip 3a when the adhesive is cured.

Then, adhesive is applied to the top surface of the spacer 4a, and the spacer 4b is placed thereon. The spacer 4b is fixed onto the spacer 4a when the adhesive is cured.

After that, adhesive is applied to the top surface of the spacer 4b, and the semiconductor chip 3b is placed thereon. The semiconductor chip 3b is fixed onto the spacer 4b when the adhesive is cured. Then, an electrode formed on the peripheral surface area of the semiconductor chip 3b and an electrode formed on the substrate 2 are connected by the wire 5b such as a gold wire.

Further, adhesive is applied to the top surface of the semiconductor chip 3b, and the semiconductor chip 3c is placed thereon. The semiconductor chip 3c is fixed onto the semiconductor chip 3b when the adhesive is cured.

Finally, the sealing resin 6, which is a thermosetting resin in this example, is injected and heat-cured, thereby packaging the above elements. The semiconductor device is thereby produced.

As described above, this embodiment uses a combination of two spacers having different principal surfaces and thereby prevents flexure of the semiconductor chip placed on the spacer. If the upper spacer has a larger principal surface than the lower spacer, it is possible to prevent flexure of the upper semiconductor chip more effectively while creating a space for wire bonding of the lower semiconductor chip.

Second Embodiment

A second embodiment of the present invention also uses a combination of two spacers having different principal surfaces just like the first embodiment. This embodiment, however, is different from the first embodiment in the thickness of the spacers. The elements other than the spacers are basically the same as those described in the first embodiment and thus not described below.

Specifically, the total thickness of the combined spacers is designed to be the minimum thickness required for creating a space for wire bonding of the lower semiconductor chip 3a. The thickness of each of the spacers 4a and 4b is half of the total thickness of the spacers, for example, which is smaller than the above minimum thickness. Thus, even if a void occurs as described earlier, the diameter of the void at maximum is as small as the thickness of the spacer with a smaller principal surface, which is the spacer 4a in this example, so that the void has no significant effect.

Figure 2:
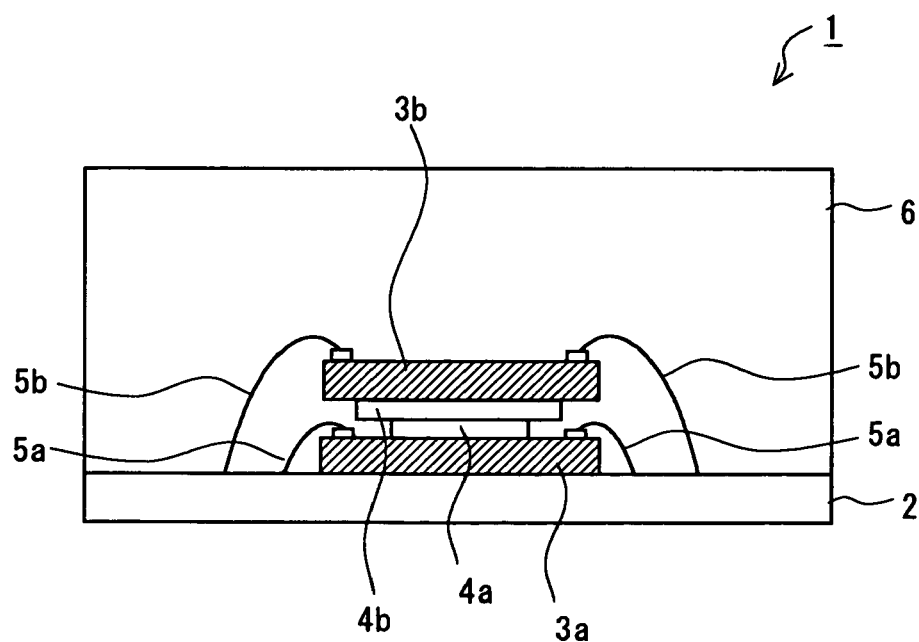
FIG. 2 is a fragmentary sectional view showing the structure of a semiconductor device according to a second embodiment of the invention.

In FIG. 2, the upper spacer 4b has a larger principal surface than the lower spacer 4a. Thus, the semiconductor device of the second embodiment, just like that of the first embodiment, allows effectively preventing the flexure of the upper semiconductor chip while creating a space for wire bonding of the lower semiconductor chip.

Third Embodiment

A third embodiment of the present invention also uses a combination of two spacers having different principal surfaces just like the first and second embodiments. This embodiment, however, is different from the first and second embodiments in the thickness of the spacers. The elements other than the spacers are basically the same as those described in the first embodiment and thus not described below. In this embodiment, the upper spacer 4b has a smaller principal surface than the lower spacer 4a as shown in FIG. 3, which is different from the second embodiment.

Specifically, the total thickness of the combined spacers is designed to be the minimum thickness required for creating a space for wire bonding of the lower semiconductor chip 3a. The thickness of each of the spacers 4a and 4b is half of the total thickness of the spacers, for example, which is smaller than the above minimum thickness. Thus, even if a void occurs as described earlier, the diameter of the void at maximum is as small as the thickness of the spacer with a smaller principal surface, which is the spacer 4b in this example, so that the void has no significant effect.

Figure 3:
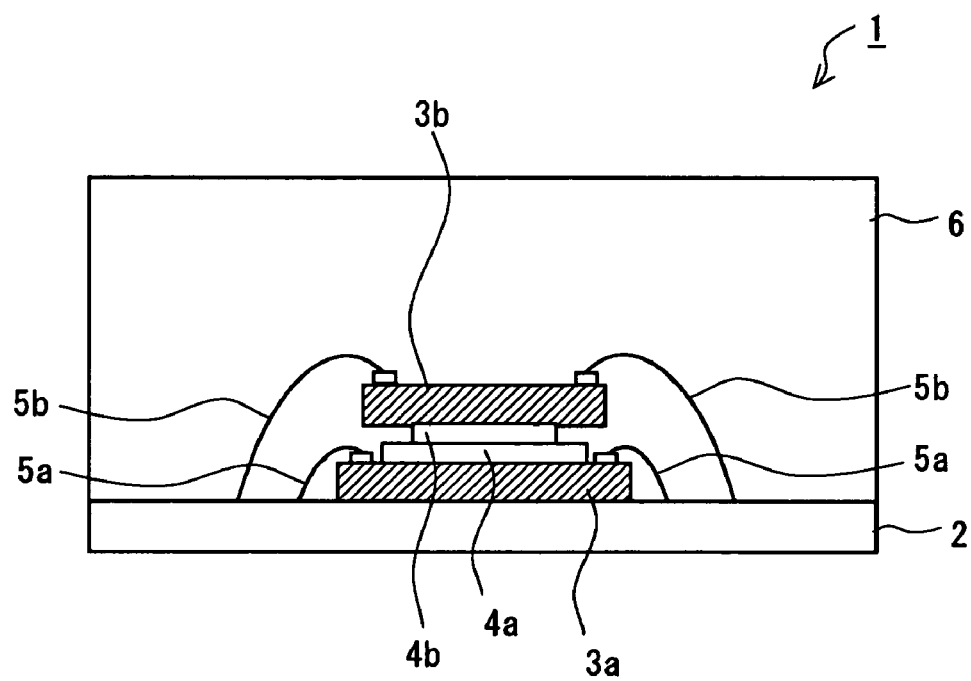
FIG. 3 is a fragmentary sectional view showing the structure of a semiconductor device according to a third embodiment of the invention.

If the lower spacer 4a has a larger principal surface than the upper spacer 4b as shown in FIG. 3, the stress imposed on the semiconductor chip 3a from the semiconductor chip 3b and the upper spacer 4b decreases, thereby preventing deterioration in the quality of the semiconductor chip 3a.

Fourth Embodiment

A fourth embodiment of the present invention also uses a combination of two spacers having different principal surfaces just like the first, second, and third embodiments. This embodiment, however, is different from those embodiments in that the principal surface of the upper spacer 4b is larger than that of the upper semiconductor chip 3b.

Figure 4:
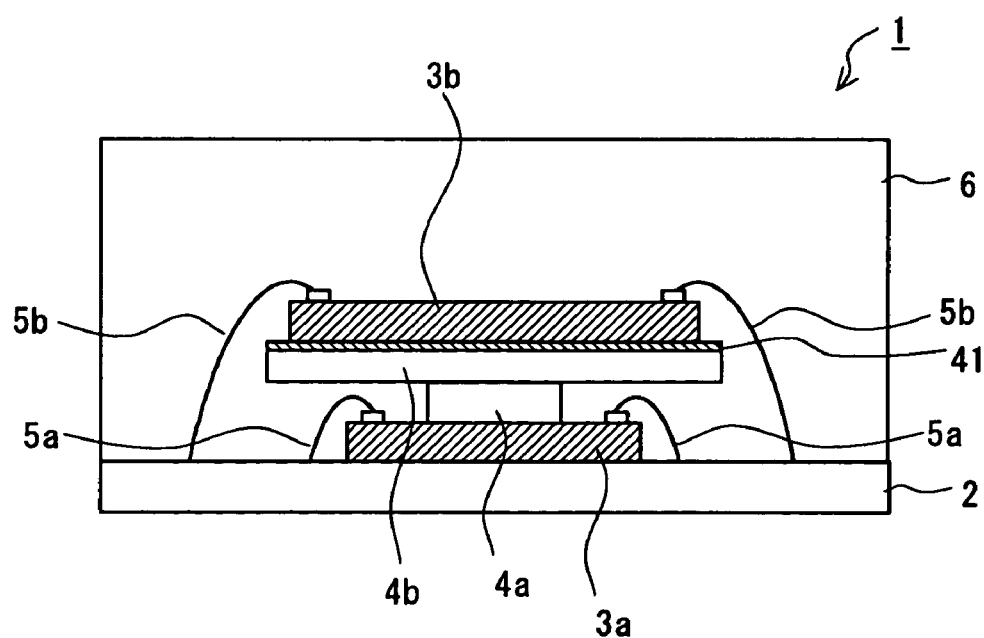
FIG. 4 is a fragmentary sectional view showing the structure of a semiconductor device according to a fourth embodiment of the invention.
Figure 5:
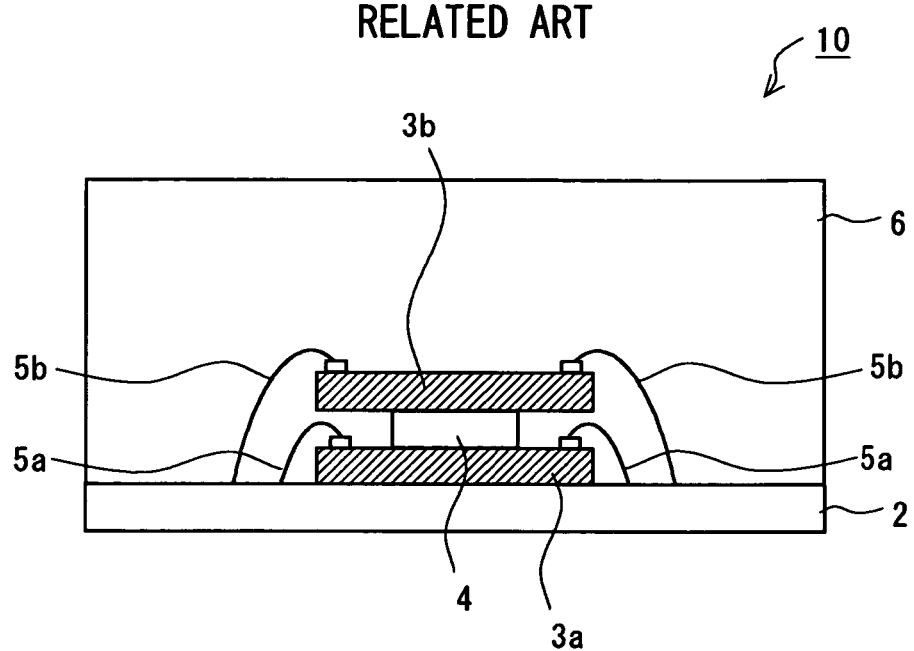
FIG. 5 is a fragmentary sectional view showing the structure of a conventional semiconductor device.
Figure 6:
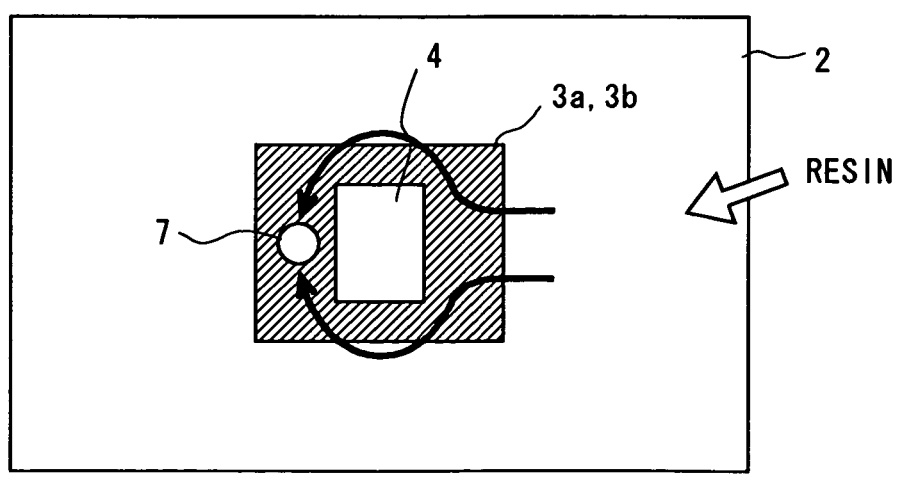
FIG. 6 is a top plan view to describe a problem in a conventional technique.

The spacer 4b can therefore prevent electromagnetic noise generated in the lower semiconductor chip 3a from being transmitted to the upper semiconductor chip 3b. Further, this embodiment forms a metal film 41, such as an aluminum film, a tungsten film, and a titanium nitride film, as an electromagnetic wave shielding film all over one surface, which is the top surface in this example, of the spacer 4b as shown in FIG. 4. This allows preventing noise transmission more effectively. The noise transmission may be made from the upper semiconductor chip 3b to the lower semiconductor chip 3a as well, and the spacer 4b can effectively avoid the noise transmission in this case also. Thus, the spacer 4b can shield noise.

In FIG. 4, the upper spacer 4b has a larger principal surface than the lower spacer 4a. Thus, the semiconductor device of the fourth embodiment, just like that of the first embodiment, allows effectively preventing the flexure of the upper semiconductor chip while creating a space for wire bonding of the lower semiconductor chip.

Other Embodiments

Though the above embodiments describe the cases of using a combination of two spacers 4a and 4b, the same advantages can be obtained by using a combination of three or more spacers. In this case, the first embodiment preferably increases the principal surface area of the spacer gradually as getting closer to the top or to the upper semiconductor chip 3b. The second embodiment preferably places the spacers with large and small principal surface areas alternately and repeatedly on one another to further reduce the size of a void. For example, the lower middle spacer 4b is larger than the lowest spacer 4a, the upper middle spacer 4c is smaller than the spacer 4b, and the upper spacer 4b is larger than the spacer 4c.

It is preferred to design to include a plurality of semiconductor chips 3 in one package and replace an unnecessary semiconductor chip 3 with a dummy spacer. The dummy spacer is preferably silicon with an aluminum film formed on one surface.

It is apparent that the present invention is not limited to the above embodiment that may be modified and changed without departing from the scope and spirit of the invention.

What is claimed is:

1. A semiconductor device package comprising:
   a plurality of semiconductor chips stacked on one another; and
   a spacer interposed between the plurality of semiconductor chips, the spacer at least comprising a first spacer and a second spacer placed above the first spacer,
   wherein the first spacer and the second spacer have different principal surface areas, and
   wherein the first spacer and the second spacer are each formed of a silicon wafer.

2. The semiconductor device package of claim 1, wherein the second spacer has a larger principal surface than the first spacer.

3. The semiconductor device package of claim 1, wherein the first spacer has a larger principal surface than the second spacer.

4. The semiconductor device package of claim 1, wherein a total thickness of the first spacer and the second spacer is a thickness required for wire bonding of a semiconductor chip located below the spacer.

5. The semiconductor device package of claim 1, wherein a thickness of the first spacer is a thickness required for wire bonding of a semiconductor chip located below the first spacer.

6. The semiconductor device package of claim 5, wherein the first spacer and the second spacer have substantially the same thickness.

7. The semiconductor device package of claim 1, wherein either one of the first spacer and the second spacer is thinner than one of the plurality of semiconductor chips.

8. The semiconductor device package of claim 7, wherein the first spacer and the second spacer have substantially the same thickness.

9. The semiconductor device package of claim 1, wherein the second spacer has a larger principal surface than a semiconductor chip placed above the second spacer.

10. The semiconductor device package of claim 9, wherein an electromagnetic wave shielding film is formed on at least all over one surface of the second spacer.

11. The semiconductor device package of claim 10, wherein the electromagnetic wave shielding film is an aluminum film.

12. The semiconductor device package of claim 1, further comprising a substrate attached to a semiconductor chip placed lowest of the plurality of semiconductor chips, and having electrodes connected to electrodes formed on peripheral areas of the plurality of semiconductor chips by wire bonding.

13. A semiconductor device package, comprising:
    a first semiconductor chip;
    a first spacer mounted on said first semiconductor chip;
    a second spacer mounted on said first spacer;
    a second semiconductor chip mounted on said second spacer;
    a first bonding layer intervening between said first semiconductor chip and said first spacer and bonding said first spacer to said first semiconductor chip; and
    a second bonding layer intervening between said second spacer and said second semiconductor chip and bonding said second semiconductor chip to said second spacer.

14. The semiconductor device according to claim 13, further comprising:
    a third bonding layer intervening between said first spacer and said second spacer and bonding said second spacer to said first spacer.

* * * * *